US012812817B2

(12) United States Patent
Shedd

(10) Patent No.: US 12,812,817 B2
(45) Date of Patent: Nov. 24, 2026

(54) APPARATUS FOR LIQUID COLLECTION

(71) Applicant: Dell Products L.P., Round Rock, TX (US)

(72) Inventor: Timothy Allen Shedd, Lithia, FL (US)

(73) Assignee: Dell Products L.P., Round Rock, TX (US)

( * ) Notice: Subject to any disclaimer, the term of this patent is extended or adjusted under 35 U.S.C. 154(b) by 341 days.

(21) Appl. No.: 18/757,911

(22) Filed: Jun. 28, 2024

(65) Prior Publication Data

US 2026/0006756 A1 Jan. 1, 2026

(51) Int. Cl.
*H05K 7/20* (2006.01)

(52) U.S. Cl.
CPC ..... *H05K 7/20636* (2013.01); *H05K 7/20263* (2013.01); *H05K 7/20272* (2013.01)

(58) Field of Classification Search
CPC .................................................. H05K 7/20636
See application file for complete search history.

(56) References Cited

U.S. PATENT DOCUMENTS

| | | | | |
|---|---|---|---|---|
| 9,635,003 | B1 | 4/2017 | Lackey | |
| 2021/0111886 | A1 | 4/2021 | Leiserson | |
| 2021/0397712 | A1 | 12/2021 | Gajananan | |
| 2023/0063710 | A1* | 3/2023 | Gao | H05K 7/20509 |
| 2024/0022609 | A1 | 1/2024 | Smith | |

* cited by examiner

*Primary Examiner* — Stanley Tso
(74) *Attorney, Agent, or Firm* — WOMBLE BOND DICKINSON (US) LLP

(57) ABSTRACT

Methods, systems, and devices for managing a data processing system that provides computer implemented services are disclosed. To provide the computer implemented services, a system may include hardware components in a chassis of the data processing system. A liquid cooling system may dissipate heat generated by the hardware components. The liquid cooling system may include a cooling path adapted to direct a liquid through at least a portion of the chassis. To extract a portion of the liquid in the chassis that escaped from the cooling path and into an interior of the chassis, the system may further include a liquid collection system. This liquid collection system may include an aggregation component adapted to direct the portion of the liquid to a liquid redirection component, and the liquid redirection component adapted to flow the portion of the liquid at least out from under the chassis.

20 Claims, 10 Drawing Sheets

APPARATUS FOR LIQUID COLLECTION

FIELD

Embodiments disclosed herein relate generally to management of data processing systems. More particularly, embodiments disclosed herein relate to systems and methods for mitigating damage to data processing systems.

BACKGROUND

Computing devices may provide computer-implemented services. The computer-implemented services may be used by users of the computing devices and/or devices operably connected to the computing devices. The computer-implemented services may be performed with hardware components such as processors, memory modules, storage devices, and communication devices. The operation of these components may impact the performance of the computer-implemented services.

BRIEF DESCRIPTION OF THE DRAWINGS

Embodiments disclosed herein are illustrated by way of example and not limitation in the figures of the accompanying drawings in which like references indicate similar elements.

DETAILED DESCRIPTION

Figure 1:
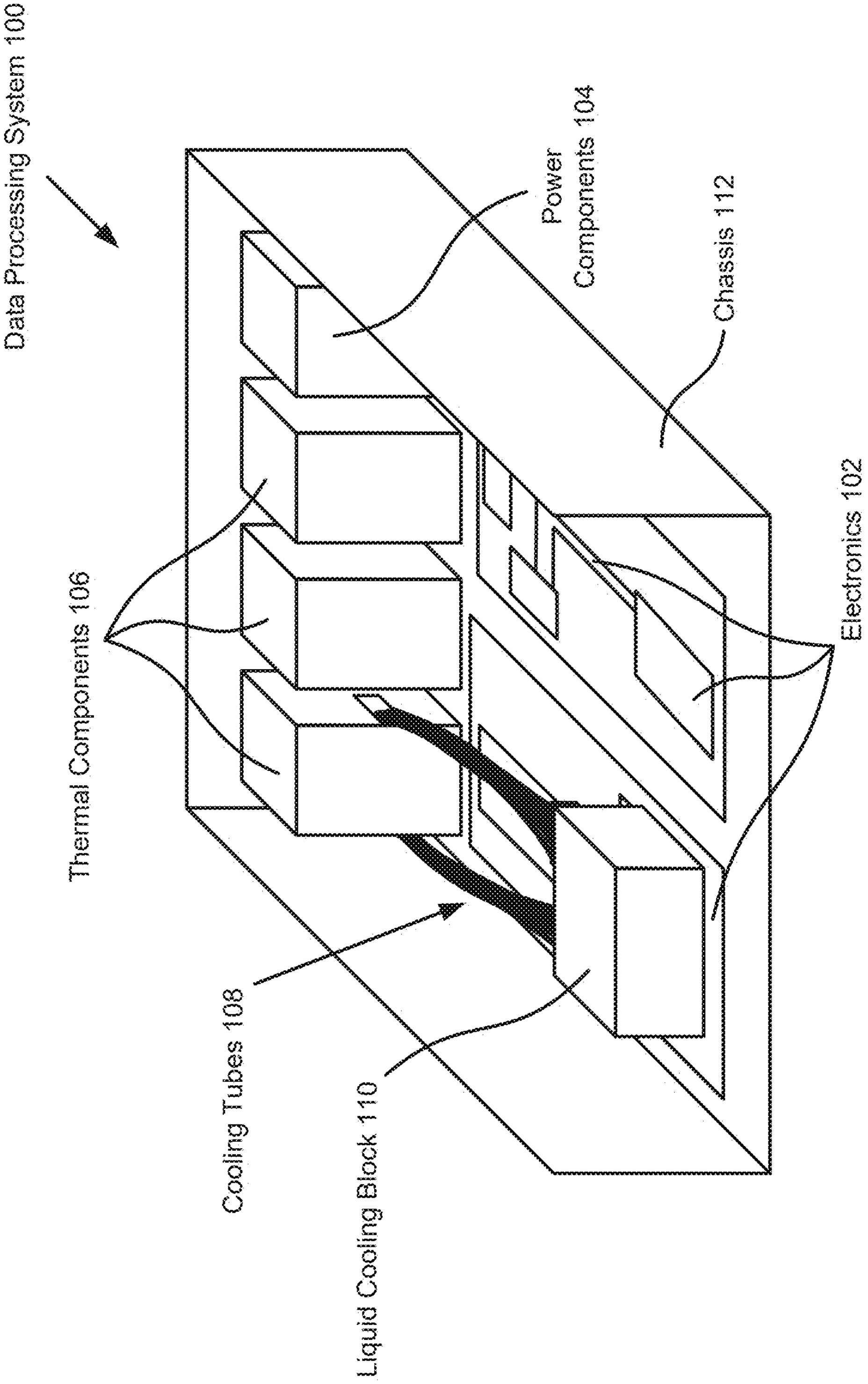
FIG. 1 shows a block diagram illustrating a system in accordance with an embodiment.

Various embodiments will be described with reference to details discussed below, and the accompanying drawings will illustrate the various embodiments. The following description and drawings are illustrative and are not to be construed as limiting. Numerous specific details are described to provide a thorough understanding of various embodiments. However, in certain instances, well-known or conventional details are not described in order to provide a concise discussion of embodiments disclosed herein.

Reference in the specification to "one embodiment" or "an embodiment" means that a particular feature, structure, or characteristic described in conjunction with the embodiment can be included in at least one embodiment. The appearances of the phrases "in one embodiment" and "an embodiment" in various places in the specification do not necessarily all refer to the same embodiment.

References to an "operable connection" or "operably connected" means that a particular device is able to communicate with one or more other devices. The devices themselves may be directly connected to one another or may be indirectly connected to one another through any number of intermediary devices, such as in a network topology.

In general, embodiments disclosed herein relate to methods and systems for managing data processing systems that may provide, at least in part, computer implemented services. The computer implemented services may be provided to any type and/or number of other devices and/or users of the data processing systems. Furthermore, the provided computer implemented services may be of any quantity and/or type of such services.

To provide the computer implemented services, data processing systems may include hardware components. For example, operation of these hardware components may facilitate various functionalities of a data processing system, thereby causing the data processing system to provide the computer implemented services.

However, the operation of said hardware components may generate heat. To regulate this heat, a liquid cooling system may be used to circulate a cooling liquid to dissipate at least a portion of the heat generated by the hardware components.

However, by circulating the cooling liquid (and/or otherwise have liquid within the system), a likelihood of liquid damage may be increased within the system. For example, should the liquid cooling system leak at least a portion of the liquid, the hardware components may be vulnerable to liquid damage.

Consequently, such liquid damage may negatively impact the operation of the hardware components. In turn, this damage may also negatively impact the computer implemented services to be provided by the system.

To decrease the likelihood of these negative impacts, a liquid collection system may be used to extract the at least a portion of the liquid in a chassis of the system that escaped from an enclosed passage, through which the cooling liquid may be directed (e.g., a cooling loop), at least partially housed by the chassis. For example, this liquid collection system may be used with a rack system in which one or more chassis are mounted.

In an embodiment, a rack system is provided.

This rack system may include a chassis adapted to house hardware components of a data processing system that provides computer implemented services; a liquid cooling system adapted to dissipate heat generated by the hardware components, the liquid cooling system comprising a cooling path adapted to direct a liquid through at least a portion of the chassis; and a liquid collection system adapted to extract a portion of the liquid in the chassis that escaped from the cooling path and into an interior of the chassis.

The liquid collection system may include an aggregation component that is positioned below the chassis and adapted to direct the portion of the liquid to a liquid redirection component; and the liquid redirection component that is positioned with the aggregation component and adapted to flow the portion of the liquid at least out from under the chassis.

The liquid collection system may further include a canal component that is adapted to receive at least a sub-portion of the portion of the liquid from the liquid redirection component.

The liquid redirection component may be further adapted to flow the at least the sub-portion of the portion of the liquid into an interior of the canal component.

The canal component may include a hollow tubular member positioned adjacent to the chassis; and an aperture that is positioned on an exterior of the hollow tubular member and adapted to facilitate access to the interior of the canal component by at least a portion of the liquid redirection component.

The hollow tubular member may be adapted to prevent ambient airflow from ejecting the at least the sub-portion of the portion of the liquid from the interior of the canal component.

The canal component may be in fluid communication with a drain to facilitate graceful removal of the at least the sub-portion of the portion of the liquid from the rack system.

The liquid redirection component may include a plurality of lateral members oriented with and positioned along a length of the chassis; at least one manifold adapted to receive the portion of the liquid from the plurality of lateral members; and at least one fluid disposal member in fluid communication with the manifold and positioned to flow the at least the sub-portion of the portion of the liquid out from under the chassis.

At least a portion of the lateral members, the at least one manifold, and the at least one fluid disposal member may be formed from a liquid wicking material.

The aggregation component may include a sheet of liquid impermeable material; and at least one attachment member adapted to attach the sheet to the chassis.

The chassis may be positioned above a second chassis in the rack system, and the aggregation component may have a thickness that is less than a distance between the chassis and the second chassis.

The at least one attachment member may include an adhesive to fixedly secure the sheet to the chassis, and when secured to the chassis the sheet may be separated from the chassis by at least a thickness of the liquid redirection component.

In an embodiment, a liquid collection system for use with a data processing system are provided as discussed above.

In an embodiment, a liquid collection system for use with an enclosure are provided as discussed above.

Turning to FIG. 1, a block diagram illustrating a system in accordance with an embodiment is shown. The system shown in FIG. 1 may be a distributed system that provides for management of data processing systems that may provide, at least in part, computer implemented services.

Figure 2A:
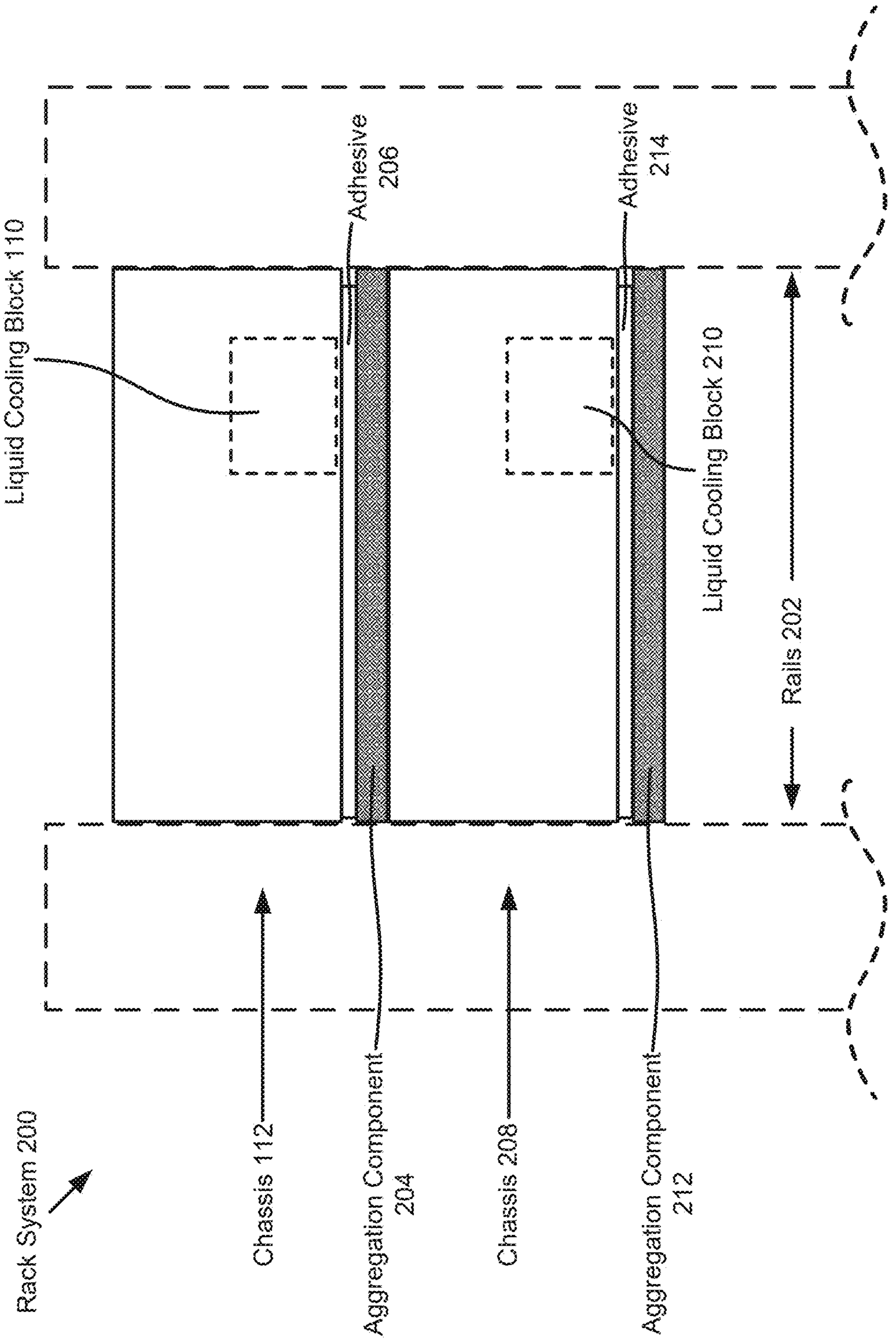
FIGS. 2A-2G show diagrams illustrating a liquid collection system in accordance with an embodiment.

The computer implemented services may include any type and quantity of computer implemented services. The computer implemented services may include, for example, database services, data processing services, electronic communication services, and/or any other services that may be provided using one or more computing devices. The computer implemented services may be provided by, for example, any portion of processing system 100, and/or any other type of devices positioned with a rack mount chassis system in which data processing system 100 may be placed (e.g., as shown in FIG. 2A).

Other types of computer implemented services may be provided by the system shown in FIG. 1 without departing from embodiments disclosed herein.

To provide the computer implemented services, data processing systems may include any number of hardware components. For example, operation of the any number of hardware components may facilitate various functionalities of a data processing system, thereby causing the data processing system to provide the computer implemented services.

For example, to facilitate the various functionalities, a hardware component may transmit data with other devices via various avenues of communication. For example, such avenues of communication may depend on physical operable connections that directly connect multiple hardware components to one another. To provide the above noted functionality, the system of FIG. 1 may include data processing system 100.

Data processing system 100 may include electronics 102, chassis 112, power components 104, and thermal components 106. Each of these is discussed below.

Electronics 102 may, as noted above, provide computer implemented services. Electronics 102 may include at least a portion of the any number of hardware components. The any number of hardware components may be positioned on circuit cards and may generate heat during operation. Circuit cards may be pieces of circuit boards.

Electronics 102 and/or any other components of the number of hardware components of data processing system 100 may be positioned in chassis 112. Chassis 112 may include an enclosure in which physical structures of electronics 102 (e.g., processors, memory, etc.), and/or other components of data processing system 100 may be positioned. For example, chassis 112 may facilitate placement and management of electronics 102 and/or other components (e.g., power components 104 and/or thermal components 106) in a computing environment such as those discussed below.

Power components 104 may power the any number of hardware components of data processing system 100. For example, power components 104 may be implemented using power supplies. Furthermore, these power supplies may also generate the heat during their operation, the heat, if left unregulated, increasing the likelihood of damage as previously mentioned.

To manage the heat, data processing system 100 may include a liquid cooling system that is at least partially housed by chassis 112. This liquid cooling system may use a number of cooling components such as thermal components 106, and/or any other cooling components not shown in the system of FIG. 1.

Thermal components 106 may thermally manage any of the components of data processing system 100. For example, thermal components 106 may include thermal components such as cooling fans, coolant reservoirs, chillers, coolant circulation pumps, and/or other components to facilitate performance of liquid-based cooling of some of electronics 101. For example, thermal components 106 may be used with cooling tubes 108 and liquid cooling block 110.

Liquid cooling block 110 may facilitate heat dissipation of heat generated by, for example, electronics 102 by allowing a transference of heat to a cooling liquid confined to a flow path that, for example, circulates through a loop of a liquid cooling system (e.g., the liquid cooling system including at least a portion of thermal components 106, cooling tubes 108 and liquid cooling block 110).

For example, the cooling liquid may be directed through an interior of liquid cooling block 110 and through a first portion of cooling tubes 108. Cooling tubes 108 may further facilitate the circulation by directing the cooling liquid, for example, to other portions of thermal components 106 adapted to cool the cooling liquid. To do so, cooling tubes 108 may include hollow, tubular structures in which liquid may flow through. For example, the cooling liquid, once cooled by the other portions, may then be further circulated through a second portion of cooling tubes 108 to direct the cooling liquid back through the liquid cooling block 110 to facilitate transference of additional heat generated by electronics 102.

However, by using the liquid cooling system discussed above, a likelihood of physically damaging the any number of hardware components (e.g., should a leak in liquid cooling block 110 and/or cooling tubes 108 occur) may be increased due to the presence of the cooling liquid. For example, if liquid cooling block 110 and/or cooling tubes 108 begin to leak, at least a portion of the cooling liquid may no longer be confined to the flow path that circulates through the loop of a liquid cooling system.

Consequently, should the any number of hardware components become exposed to liquid (e.g., the cooling liquid), functionality of the any number of hardware components may be negatively impacted, thereby negatively impacting the computer implemented services.

To mitigate this exposure, thereby decreasing the likelihood of damaging the hardware components, a liquid collection system may be used. This liquid collection system may manage a traversal path of the at least a portion of the cooling liquid that has escaped the circulation via the leak. Thus, the at least a portion of the liquid in the chassis that escaped from the loop may be extracted.

To do so, the liquid collection system may include (i) an aggregation component, (ii) a liquid redirections component, and/or (iii) a canal component. Each of these components is discussed further below with regard to FIGS. 2A-2G.

While illustrated in FIG. 1 with a limited number of specific components, a data processing system may include additional, fewer, and/or different components without departing from embodiments disclosed herein.

To further clarify embodiments disclosed herein, diagrams illustrating examples of data processing systems (and portions thereof) in accordance with embodiments are shown in FIGS. 2A-2G.

As previously discussed, hardware components of data processing system 100 may generate heat during their operation. This heat may be regulated (e.g., dissipated) by the liquid cooling system of data processing system 100 (e.g., shown in FIG. 1). However, by using a liquid within a system (e.g., of FIG. 1), the likelihood of negatively impacting computer implemented services may be increased. Therefore, to decrease this likelihood, a liquid collection system may be used. To do so, the liquid collection system may include (i) an aggregation component, (ii) a liquid redirections component, and/or (iii) a canal component. Each of these is discussed below with regard to FIGS. 2A-2G.

Turning to FIG. 2A, a first diagram illustrating a rear view of a rack system (e.g., 200) in accordance with an embodiment is shown. As shown in FIG. 2A, rack system 200 may include any number of mounted data processing systems such as data processing system 100 discussed with regard to FIG. 1 (e.g., illustrated with chassis 112 and liquid cooling block 110), a second data processing system (e.g., illustrated with chassis 208 and liquid cooling block 210) positioned below data processing system 100, and/or any other data processing system not shown in FIG. 2A.

Rack system 200 may be used to position and/or otherwise manage various chassis with regard to one another. To do so, rack system 200 may include rails 202 to fixedly secure each chassis to a respective height between the rails. For example, the second chassis may be positioned just under data processing system 100, separated by a distance along the length of rails 202.

As previously mentioned, to mitigate the likelihood of damage caused by liquid that may leak from, for example, liquid cooling block 110, a liquid collection system may be used. This liquid collection system may include an aggregation component (e.g., 204 and/or 212).

Aggregation component 204 (e.g., or 212) may direct the portion of the liquid to a liquid redirection component. To do so, aggregation component 204 may be positioned below data processing system 100. Therefore, should any liquid escape liquid cooling block 110, gravity may cause the liquid to drip onto aggregation component 204. Additionally, a shape of aggregation component 204 may (i) prevent the liquid from dripping onto the second data processing system, and (ii) allow the liquid to at least temporarily make physical contact with the liquid redirection component (discussed further with regard to FIG. 2B) before being made to follow along a length of the redirection component.

To provide its functionality, aggregation component 204 may include a sheet of liquid impermeable material and at least one attachment member adapted to attach the sheet to the chassis. The at least one attachment member may be implemented with, for example, an adhesive (e.g., 206). The sheet may have a thickness that is less than the distance along the length of rails 202 that separates data processing system 100 and the second data processing system, thereby allowing aggregation component 204 to be positioned within the distance. While illustrated in FIG. 2A as extending across the width of the chassis, it will be appreciated that adhesive 206 may be smaller in size, may be divided into various portions (e.g., multiple adhesive portions), and/or may have other topologies than as shown in FIG. 2A without departing from embodiments disclosed herein.

It will be appreciated that, although discussed with regard to a single aggregation component (204), a liquid collection system used with a rack system (e.g., 200) may include any number of aggregation components, thereby allowing there to be an aggregation component positioned under each respective chassis. For example, while data processing system 100 may include chassis 112 and liquid cooling block 110, the second data processing system may include chassis 208 and liquid cooling block 210. Thus, while data processing system 100 is positioned above aggregation component 204 (fixedly attached to one another by adhesive 206), the second data processing system may be positioned above aggregation component 212 (fixedly attached to one another by adhesive 214).

Figure 2B:
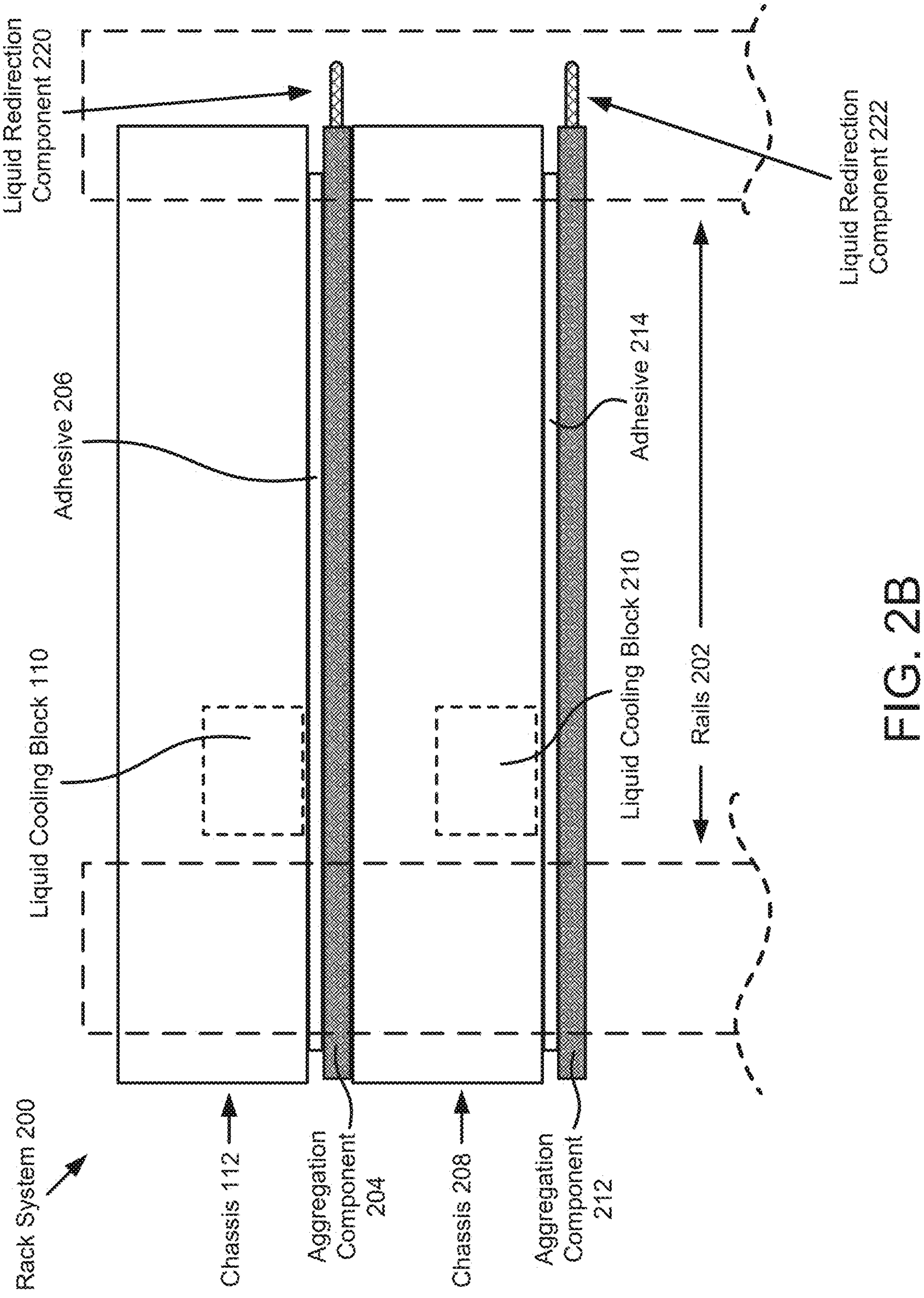

Turning to FIG. 2B, a second diagram illustrating a side viewpoint of the rack system (e.g., 200) in accordance with an embodiment is shown.

As previously mentioned, should a portion of liquid leak from, for example, liquid cooling block 110, aggregation component 204 may direct the portion of the liquid to a liquid redirection component (e.g., 220).

As shown in FIG. 2B, liquid redirection components 220 and 222 extend from where there is physical contact with aggregation components 204 and 212, respectively, to an interior (or behind) rails 202. This interior (or behind) may be where, for example, a canal component is positioned. For additional information regarding the canal component, refer to FIGS. 2C-2D.

Liquid redirection components 220 and 222 may flow portions of liquid leaking from their respective chassis at least out from under the respective chassis (e.g., along the above-mentioned extensions). To do so, Liquid redirection components 220 and 222 may be formed from a liquid wicking material. For additional information regarding liquid redirection components (e.g., 220 and 222), refer to FIG. 2C.

Figure 2C:
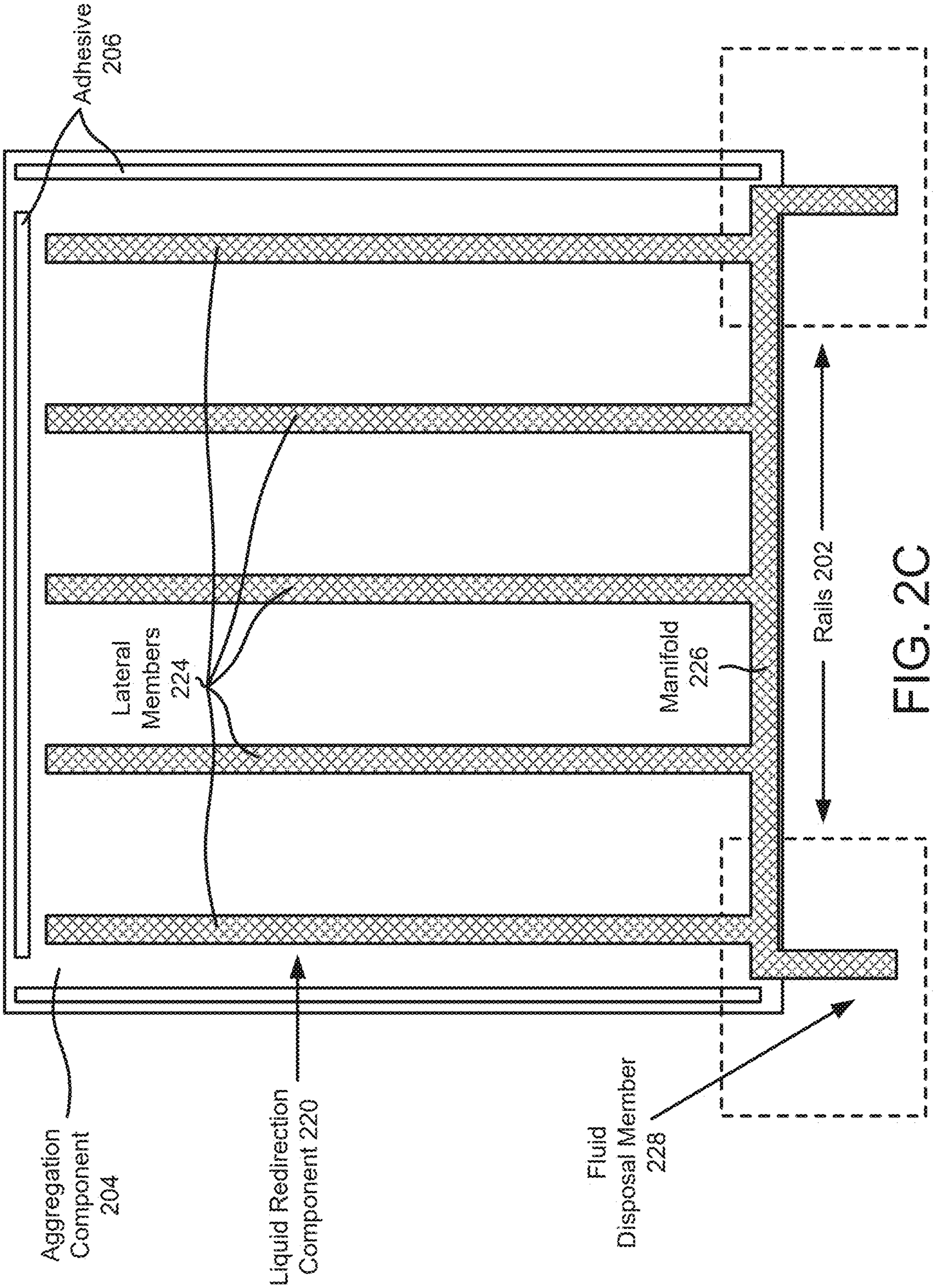

Turning to FIG. 2C, a third diagram illustrating a top-down viewpoint of the rack system (e.g., 200) with regard to aggregation component 204 in accordance with an embodiment is shown.

As previously mentioned, liquid redirection component 220 may, for example, flow the portion of the liquid at least out from under the chassis. To do so, liquid redirection component 220 may include (i) a plurality of lateral members 224 oriented with and positioned along a length of chassis 112, (ii) at least one manifold (e.g., 226) adapted to receive the portion of the liquid from the plurality of lateral members, and (iii) at least one fluid disposal member (e.g., 228) in fluid communication with the manifold and positioned to flow the at least the sub-portion of the portion of the liquid out from under the chassis. Each of these is discussed below.

As previously discussed, liquid redirection component 220 may be formed from a liquid wicking material. Therefore, plurality of lateral members 224, manifold 226, and fluid disposal member 228 may also be formed from the liquid wicking material.

When aggregation component 204 directs the portion of the liquid to liquid redirection component 220, lateral members 224 may absorb the portion of the liquid due to capillary action of the wicking material. Therefore, when the portion of the liquid makes physical contact with any of lateral members 224, the any of lateral members 224 may cause automatic transport of the portion of the liquid to manifold 226.

Manifold 226 may be a portion of liquid redirection component 220 that joins each of the any of lateral members 224 with one another, manifold 226 being in fluid communication with each of lateral members 224. Due to the capillary action of lateral members 224, and now of manifold 226, the portion of the fluid may be further transported to fluid disposal member 228.

Fluid disposal member 228 may be a portion of liquid redirection component 220 that is at an end of liquid redirection component 220, the end, for example, having a shape that meets at a single point as to facilitate an aggregation of the portion of the liquid at the single point. For example, as the capillary action causes automatic transport of the portion of the fluid from lateral members 224, through manifold 226, and then through fluid disposal member 228, the single point at which the portion of the liquid aggregates may be expelled from the interior of liquid redirection component 220 and into a portion of rails 202 (e.g., into the canal component, mentioned previously and discussed further with regard to FIG. 2D).

Therefore, by expelling the portion of the liquid from fluid disposal member 228, liquid redirection component 220 may thus flow the portion of the liquid at least out from under chassis 112.

Figure 2D:
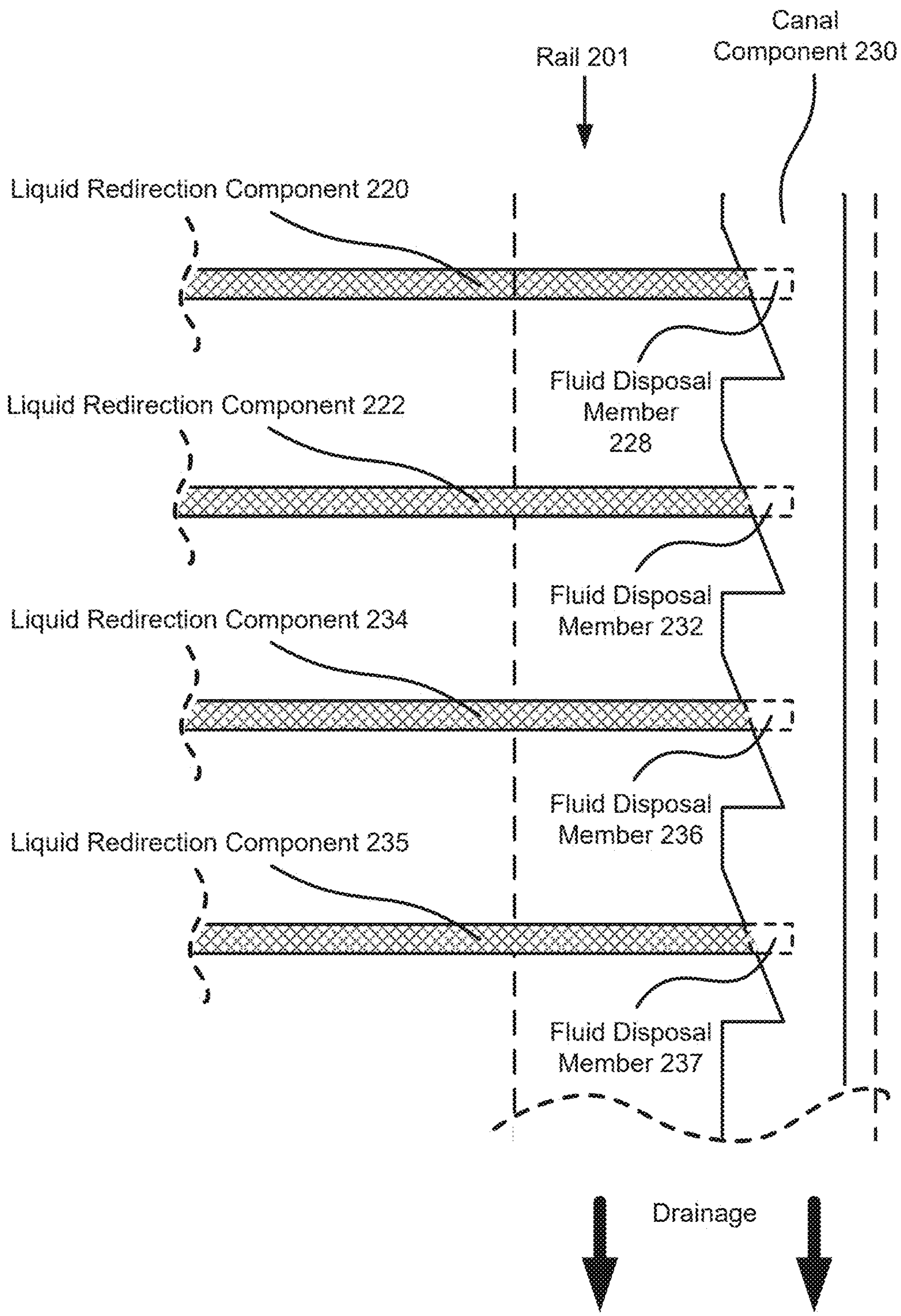

Turning to FIG. 2D, a fourth diagram illustrating a second side view of the rack system (e.g., 200), that is similar to the viewpoint of FIG. 2B, in accordance with an embodiment is shown. As shown in FIG. 2D, the viewpoint may differ to that of FIG. 2B in that this second side view may be an expanded view with regard to the liquid redirection components and canal component 230 (e.g., the canal component, previously mentioned).

It will be appreciated that although shown in FIG. 2B with two liquid redirection components (e.g., 220 and 222), FIG. 2D is shown with four liquid redirection components (e.g., 220, 222, 234, and 235) due to the fact that the rack system may include any number of chassis, each chassis being positioned above a respective aggregation component of the liquid collection system, and the liquid collection system thereby including any number of aggregation components as discussed with regard to FIG. 2A.

As shown in FIG. 2D, each liquid redirection component may have a respective fluid disposal member (e.g., 228, 232, 236, and 237). Each of these fluid disposal members may have a shape that meets at a single respective point as to facilitate an aggregation of any leaked liquid at the single respective point. Thus, each liquid redirection component may flow the any leaked liquid at least out from under each respective chassis.

Further shown in FIG. 2D, each liquid redirection component may have a fluid disposal member enter into at least a portion of an interior of canal component 230 (e.g., illustrated as a dotted-outline portion of each liquid redirection component).

For example, canal component 230 may receive at least a sub-portion of the portion of the liquid from liquid redirection component 220. Due to the aggregation of the portion of the liquid at the single point of liquid redirection component 220, discussed with regard to FIG. 2C, the sub-portion of the portion may be expelled at the single point to be dripped into the interior of canal component 230. For example, once dripped from the single point, the sub-portion of the portion may fall down toward a drainage system and/or otherwise leave rack system 200. To do so, for example, canal component 230 may be in fluid communication with a drain to facilitate graceful removal of the at least the sub-portion of the portion of the liquid from the rack system.

To provide its functionality, canal component 230 may include a hollow tubular member and an aperture. Each of these is discussed below.

The hollow tubular member may be the interior of canal component 230 and may be positioned adjacent to the chassis (e.g., 112) and at least one other chassis (e.g., 208) positioned above or below the chassis. By doing so, the hollow tubular member may prevent ambient airflow from ejecting the sub-portion of the portion of the liquid from the interior of the canal component once it has been dripped from the single point of liquid redirection component 220.

The aperture may be positioned on an exterior of the hollow tubular member and may thereby facilitate access to the interior of the canal component by at least a portion of liquid redirection component 220. For example, as shown in FIG. 2D, the portion of liquid redirection component 220 housed by the interior (the portion having a dotted outline) is illustrated over a section of canal component 220 that protrudes in a saw-tooth shape from the hollow tubular member. This saw-tooth shape may be that of the aperture.

It will be appreciated that a canal component (e.g., 230) may have any number of apertures to receive the any number of liquid redirection components.

Figure 2E:
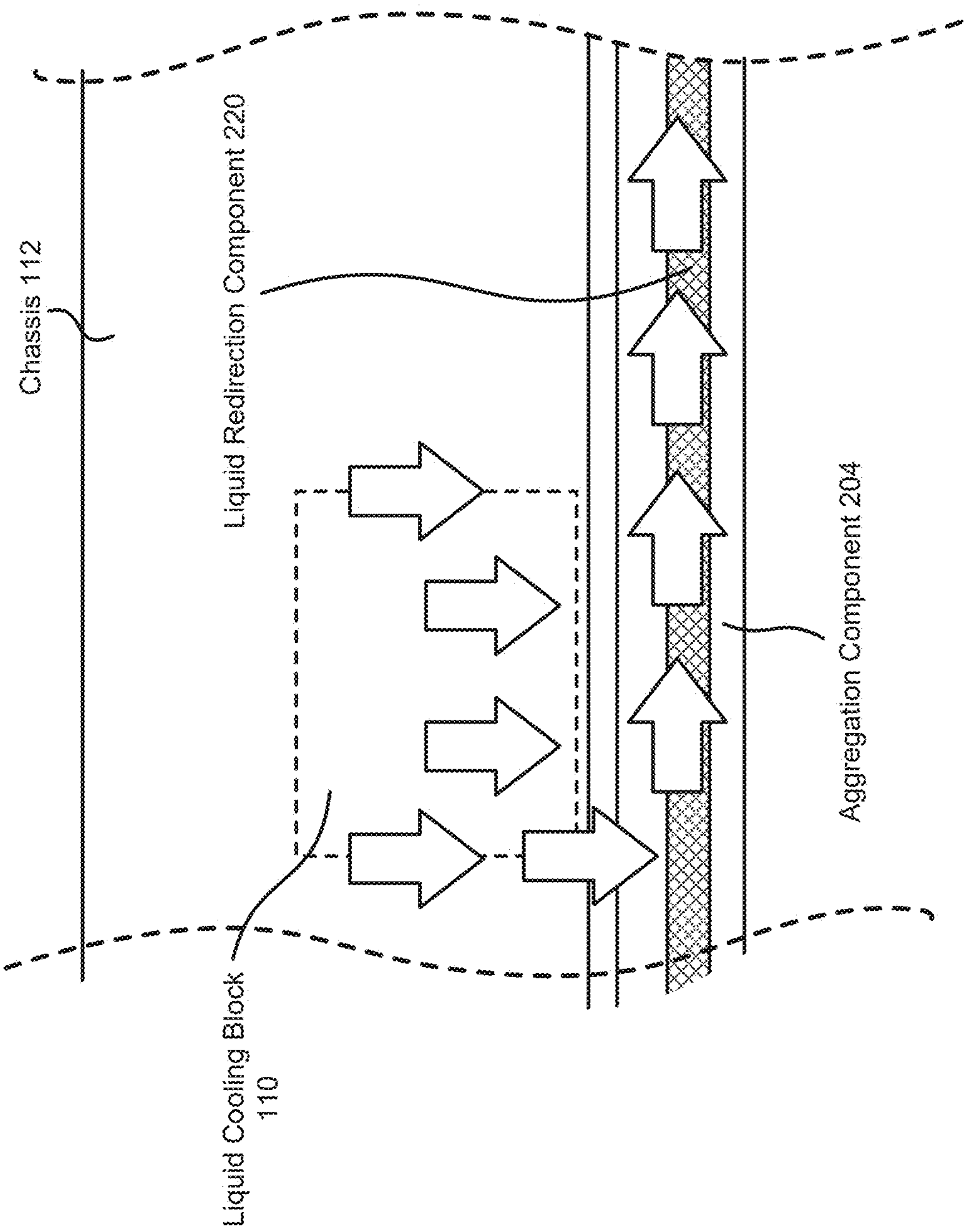
Figure 2F:
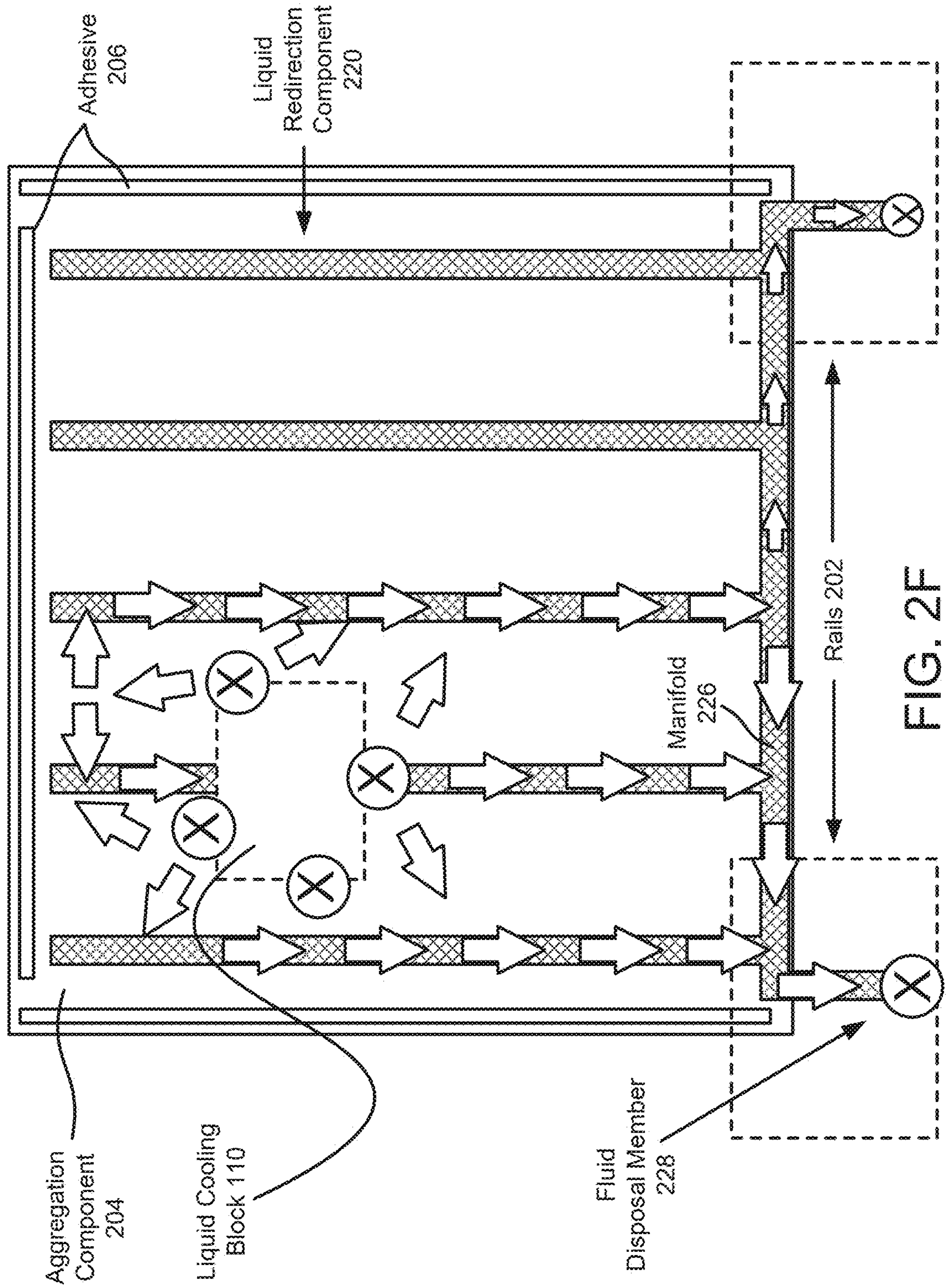
Figure 2G:
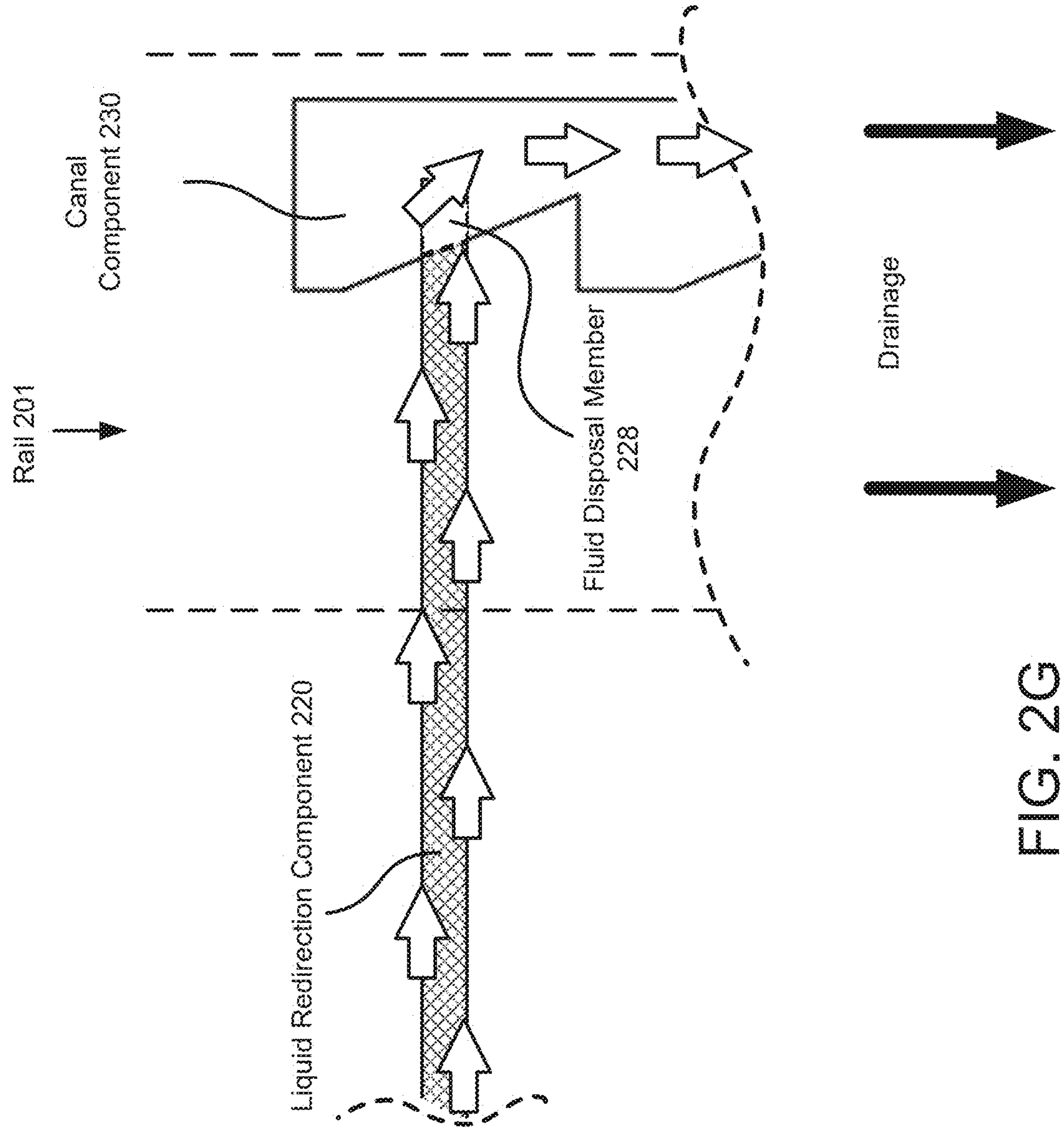

In FIGS. 2E-2G, additional diagrams of rack system 200 are shown in accordance with an embodiment. These diagrams may be used to discuss an example implementation of the liquid collection system with regard to a leak in, for example, liquid cooling block 110.

Turning to FIGS. 2E, a fifth diagram illustrating a close up of the first side view of the rack system (e.g., 200) in accordance with an embodiment is shown. As previously mentioned, and shown in FIG. 2E, liquid cooling block 110 may leak a portion of liquid (illustrated using large white arrows) used in a liquid cooling system of data processing system 100.

By having aggregation component 204 positioned below chassis 112, aggregation component 204 may catch the portion of the liquid as it influenced by gravity. Once caught, aggregation component 204 may direct the portion of the liquid to liquid redirection component 220 by causing the portion of the liquid to make physical contact with liquid redirection component 220. Capillary action caused by the wicking material, from which liquid redirection component 220 is formed, may facilitate automatic transport of the portion of the liquid as shown in FIG. 2E.

Turning to FIG. 2F, a sixth diagram illustrating the top-down view of the rack system (e.g., 200), discussed with regard to FIG. 2C, in accordance with an embodiment is shown. Similar to FIG. 2E, FIG. 2F illustrates the leak of the portion of the liquid from liquid cooling block 110 (illustrated using circled crosses to signify the portion of the liquid falling into the page). As previously discussed, the portion of the liquid may be caught by aggregation component 204.

Due to being made using a sheet of liquid impermeable material, the portion of the liquid may be prevented from (i) continuing to fall past aggregation component 204 and (ii) affecting any chassis positioned below chassis 112. This catching of the portion of the liquid is illustrated by the large white arrows falling around liquid cooling block 110 and onto aggregation component 204.

Based on the previously discussed capillary action of liquid redirection component 220, physical contact with liquid redirection component 220 may cause automatic transport of the portion of the liquid from a point of physical contact between the portion of the liquid and liquid redirection component 220, to a fluid disposal member (e.g., 228).

It will be appreciated that due to the capillary action, some of the portion of the liquid may automatically traverse to fluid disposal member 228, however, another some of the portion of the liquid may automatically traverse to another aggregation point other than fluid disposal member 228 (illustrated with a circled cross that is smaller than the other depicted circled crosses).

Turning to FIGS. 2G, a seventh diagram illustrating a close up of the second side view of the rack system (e.g., 200) in accordance with an embodiment is shown. As shown in FIG. 2G, and as previously discussed, physical contact between the portion of the liquid and liquid redirection component 220 may cause the portion of the liquid to be automatically flowed to fluid disposal member 228.

Due to the shape of fluid disposal member 228, the portion of the liquid may be aggregated at a single point, thereby allowing an influence from gravity to expunge the portion of the liquid from the single point.

Based on an insertion of a portion of liquid redirection component 220 into canal component 230, the portion (of a sub-portion thereof) of the liquid may be expelled from the wicking material and into an interior of canal component 230. Once expelled, the expelled liquid may fall through the interior until affected, for example, by the fluid communication between canal component 230 and a drain.

Thus, the liquid collection system may prevent damage caused by any leaks in a liquid cooling system by expelling leaked liquid from a chassis at least partially housing the liquid cooling system. In doing so, the likelihood of negatively impacting hardware components due to the leaked liquid may be decreased. Therefore, the likelihood of negatively impacting the computer implemented services may also be decreased.

While illustrated in FIGS. 2A-2G with a limited number of specific components, a system may include additional, fewer, and/or different components without departing from embodiments disclosed herein.

Figure 3:
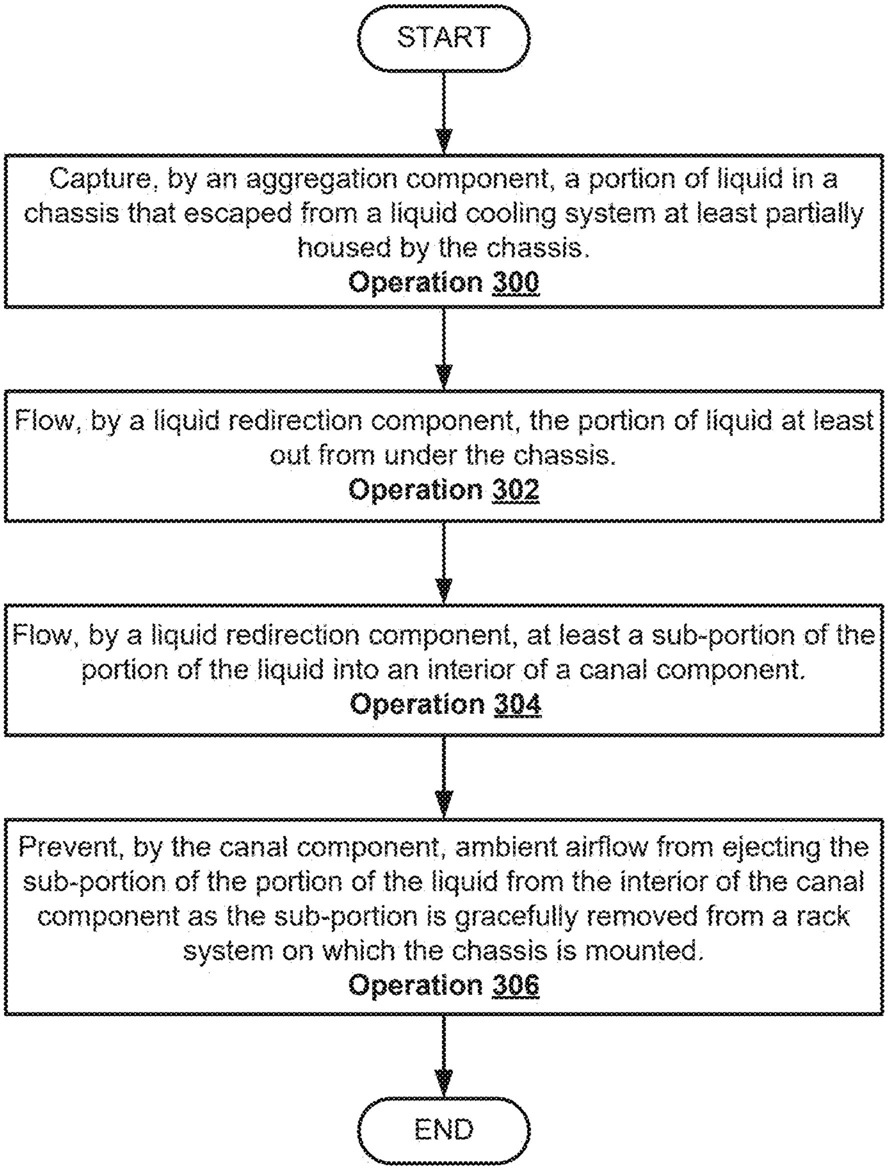
FIG. 3 shows a flow diagram illustrating a method for liquid collection by a liquid collection system in accordance with an embodiment.

As discussed above, the components of FIGS. 2A-2G may facilitate and/or perform various methods to manage data processing systems. FIG. 3 illustrates methods that may be facilitated and/or performed by the components of FIG. 2A-2G.

In the diagram discussed below and shown in FIG. 3, any of the operations may be repeated, performed in different orders, and/or performed in parallel with or in a partially overlapping in time manner with other operations.

Turning to FIG. 3, a flow diagram illustrating a method for managing operation of a data processing system by, for example, mitigating negative impacts caused by liquid that escaped from a liquid cooling system, in accordance with an embodiment is shown. The method may be facilitated and/or performed, for example, by a liquid collection system of a rack system (e.g., 200) and/or any other entity.

At operation 300, a portion of liquid in a chassis that escaped from a liquid cooling system at least partially housed by the chassis is capture by an aggregation component. The portion of the liquid may be captured by preventing the portion of the liquid from falling passed a distance at which the aggregation component is positioned.

To do so, the aggregation component may span a distance across a length and a width of the chassis while being positioned under the chassis. Therefore, as the portion of the liquid leaks, gravitational force may cause the portion of the liquid to fall toward the aggregation component, the aggregation component preventing further falling upon the portion of the liquid's impact.

At operation 302, the portion of liquid is flowed, by a liquid redirection component, at least out from under the chassis. The portion of the liquid may be flowed by capillary action of the liquid redirection component, the capillary action being caused by wicking material from which the liquid redirection component is formed.

To do so, the aggregation component, while preventing the further fall of the portion of the liquid, may cause the portion of the liquid to make physical contact with a portion of the liquid redirection component. Thus, the portion of the liquid may be automatically absorbed and flowed through the interior of the liquid redirection component. By having the liquid redirection component extend out from under the chassis, then the portion of the liquid may be flowed out from under the chassis as it is automatically flowed by the liquid redirection component.

At operation 304, at least a sub-portion of the portion of the liquid is flowed, by the liquid redirection component, into an interior of a canal component. The sub-portion of the portion may be flowed into the interior by flowing throw the liquid redirection component via the capillary action until flowing through a portion of the liquid redirection component at least partially house by the interior of the canal component. Due to a shape of the portion of the liquid redirection component, the sub-portion of the portion may aggregate at a single point. In doing so, the sub-portion of the portion may be automatically expelled and thus dripped from the single point and into the interior of the canal component.

At operation 306, ambient airflow is prevented, by the canal component, from ejecting the sub-portion of the portion of the liquid from the interior of the canal component as the sub-portion is gracefully removed from the rack system. The ambient airflow may be prevented by there being a lack of airflow intersecting a height of the canal component, a hollow tubular member with enclosed walls making up the interior of the canal component, and the sub-portion of the portion being expelled from the single point to fall down through the interior of the canal component.

The method may end following operation 306.

Thus, using the method illustrated in FIG. 3, embodiments disclosed herein may manage data processing systems while mitigating risks associated with using a liquid to facilitate such management. To do so, a liquid collection system may be used to direct paths traversed by liquid (e.g., liquid outside of a cooling loop of a liquid cooling system should the system include the liquid cooling system). In doing so, the liquid may be passively (but also automatically) removed from the systems, thereby removing the risk of damage that the liquid poses. Thus, a likelihood of negatively impacting hardware functionality may be decreased and may in turn decrease a likelihood of negatively impacting computer implemented services provided by the data processing systems.

Figure 4:
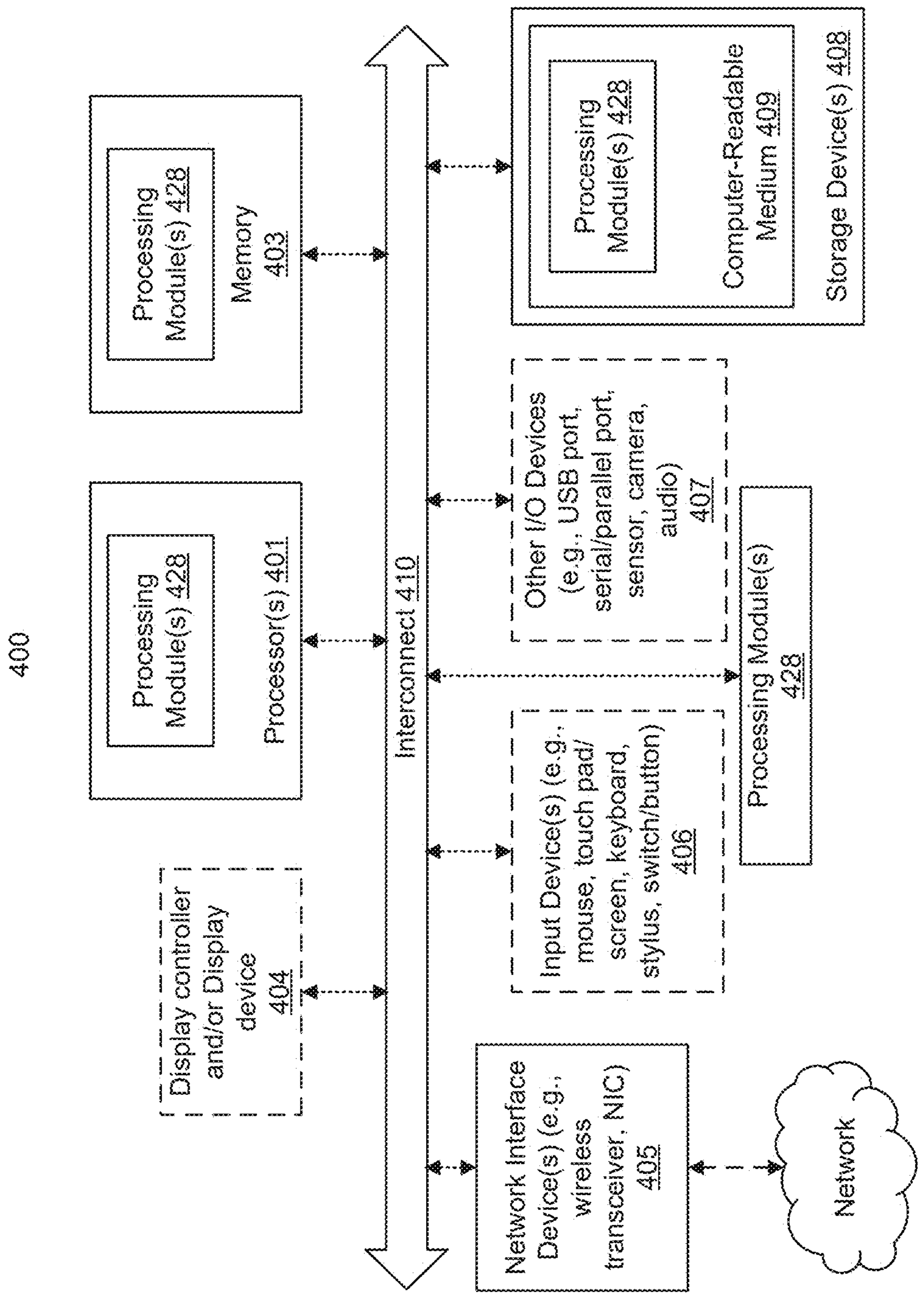
FIG. 4 shows a block diagram illustrating a data processing system in accordance with an embodiment.

The aforementioned method, and components described with respect to FIGS. 1-3, may be used with a data processing system to facilitate cooling of components of the data processing system while mitigating risk associated with using a liquid in the cooling process. Turning to FIG. 4, a block diagram illustrating an example of a data processing system (e.g., a computing device) in accordance with an embodiment is shown. For example, system 400 may represent any of data processing systems described above performing any of the processes or methods described above. System 400 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 400 is intended to show a high-level view of many components of the computer system. However, it is to be understood that additional components may be present in certain implementations and furthermore, different arrangement of the components shown may occur in other implementations. System 400 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 400 includes processor 401, memory 403, and devices 405-407 via a bus or an interconnect 410. Processor 401 may represent a single processor or multiple processors with a single processor core or multiple processor cores included therein. Processor 401 may represent one or more general-purpose processors such as a microprocessor, a central processing unit (CPU), or the like. More particularly, processor 401 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 401 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 401, which may be a low power multi-core processor socket such as an ultra-low voltage processor, may act as a main processing unit and central hub for communication with the various components of the system. Such processor can be implemented as a system on chip (SoC). Processor 401 is configured to execute instructions for performing the operations discussed herein. System 400 may further include a graphics interface that communicates with optional graphics subsystem 404, which may include a display controller, a graphics processor, and/or a display device.

Processor 401 may communicate with memory 403, which in one embodiment can be implemented via multiple memory devices to provide for a given amount of system memory. Memory 403 may include one or more volatile storage (or memory) devices such as random-access memory (RAM), dynamic RAM (DRAM), synchronous DRAM (SDRAM), static RAM (SRAM), or other types of storage devices. Memory 403 may store information including sequences of instructions that are executed by processor 401, or any other device. For example, executable code and/or data of a variety of operating systems, device drivers, firmware (e.g., input output basic system or BIOS), and/or applications can be loaded in memory 403 and executed by processor 401. An operating system can be any kind of operating systems, such as, for example, Windows® operating system from Microsoft®, Mac OS®/iOS® from Apple, Android® from Google®, Linux®, Unix®, or other real-time or embedded operating systems such as VxWorks.

System 400 may further include IO devices such as devices (e.g., 405, 406, 407, 408) including network interface device(s) 405, optional input device(s) 406, and other optional IO device(s) 407. Network interface device(s) 405 may include a wireless transceiver and/or a network interface card (NIC). The wireless transceiver may be a Wi-Fi transceiver, an infrared transceiver, a Bluetooth transceiver, a WiMAX transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 406 may include a mouse, a touch pad, a touch sensitive screen (which may be integrated with a display device of optional graphics subsystem 404), a pointer device such as a stylus, and/or a keyboard (e.g., physical keyboard or a virtual keyboard displayed as part of a touch sensitive screen). For example, input device(s) 406 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 407 may include an audio device. An audio device may include a speaker and/or a microphone to facilitate voice-enabled functions, such as voice recognition, voice replication, digital recording, and/or telephony functions. Other IO devices 407 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. IO device(s) 407 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 410 via a sensor hub (not shown), while other devices such as a keyboard or thermal sensor may be controlled by an embedded controller (not shown), dependent upon the specific configuration or design of system 400.

To provide for persistent storage of information such as data, applications, one or more operating systems and so forth, a mass storage (not shown) may also couple to processor 401. In various embodiments, to enable a thinner and lighter system design as well as to improve system responsiveness, this mass storage may be implemented via a solid-state device (SSD). However, in other embodiments, the mass storage may primarily be implemented using a hard disk drive (HDD) with a smaller amount of SSD storage to act as an SSD cache to enable non-volatile storage of context state and other such information during power down events so that a fast power up can occur on re-initiation of system activities. Also, a flash device may be coupled to processor 401, e.g., via a serial peripheral interface (SPI). This flash device may provide for non-volatile storage of system software, including a basic input/output software (BIOS) as well as other firmware of the system.

Storage device 408 may include computer-readable storage medium 409 (also known as a machine-readable storage medium or a computer-readable medium) on which is stored one or more sets of instructions or software (e.g., processing module, unit, and/or processing module/unit/logic 428) embodying any one or more of the methodologies or functions described herein. Processing module/unit/logic 428 may represent any of the components described above. Processing module/unit/logic 428 may also reside, completely or at least partially, within memory 403 and/or within processor 401 during execution thereof by system 400, memory 403 and processor 401 also constituting machine-accessible storage media. Processing module/unit/logic 428 may further be transmitted or received over a network via network interface device(s) 405.

Computer-readable storage medium 409 may also be used to store some software functionalities described above persistently. While computer-readable storage medium 409 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of embodiments disclosed herein. The term "computer-readable storage medium" shall accordingly be taken to include, but not be limited to, solid-state memories, and optical and magnetic media, or any other non-transitory machine-readable medium.

Processing module/unit/logic 428, components and other features described herein can be implemented as discrete hardware components or integrated in the functionality of hardware components such as ASICS, FPGAs, DSPs or similar devices. In addition, processing module/unit/logic 428 can be implemented as firmware or functional circuitry within hardware devices. Further, processing module/unit/logic 428 can be implemented in any combination hardware devices and software components.

Note that while system 400 is illustrated with various components of a data processing system, it is not intended to represent any particular architecture or manner of interconnecting the components as such details are not germane to embodiments disclosed herein. It will also be appreciated that network computers, handheld computers, mobile phones, servers, and/or other data processing systems which have fewer components, or perhaps more components may also be used with embodiments disclosed herein.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments disclosed herein also relate to an apparatus for performing the operations herein. Such a computer program is stored in a non-transitory computer readable medium. A non-transitory machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g., circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments disclosed herein are not described with reference to any particular programming language. It will be appreciated that a variety of programming languages may be used to implement the teachings of embodiments disclosed herein.

In the foregoing specification, embodiments have been described with reference to specific exemplary embodiments thereof. It will be evident that various modifications may be made thereto without departing from the broader spirit and scope of the embodiments disclosed herein as set forth in the following claims. The specification and drawings are, accordingly, to be regarded in an illustrative sense rather than a restrictive sense.

What is claimed is:

1. A rack system, comprising:

a chassis adapted to house hardware components of a data processing system that provides computer implemented services;

a liquid cooling system adapted to dissipate heat generated by the hardware components, the liquid cooling system comprising a cooling path adapted to direct a liquid through a at least a portion of the chassis; and a liquid collection system adapted to extract a portion of the liquid in the chassis that escaped from the cooling path and into an interior of the chassis, the liquid collection system comprises:

an aggregation component that is positioned below the chassis and adapted to direct the portion of the liquid to a liquid redirection component, the aggregation component comprises:

a sheet of liquid impermeable material; and at least one attachment member adapted to attach the sheet to the chassis, the at least one attachment member comprises an adhesive to fixedly secure the sheet to the chassis, and when secured to the chassis the sheet is separated from the chassis by at least a thickness of the liquid redirection component; and the liquid redirection component that is positioned with the aggregation component and adapted to flow the portion of the liquid at least out from under the chassis.

2. The rack system of claim 1, wherein the liquid collection system further comprises:

a canal component that is adapted to receive at least a sub-portion of the portion of the liquid from the liquid redirection component.

3. The rack system of claim 2, wherein the liquid redirection component is further adapted to flow the at least the sub-portion of the portion of the liquid into an interior of the canal component.

4. The rack system of claim 3, wherein the canal component comprises:

a hollow tubular member positioned adjacent to the chassis; and an aperture that is:

positioned on an exterior of the hollow tubular member, and adapted to facilitate access to the interior of the canal component by at least a portion of the liquid redirection component.

5. The rack system of claim 4, wherein the hollow tubular member is adapted to:

prevent ambient airflow from ejecting the at least the sub-portion of the portion of the liquid from the interior of the canal component.

6. The rack system of claim 5, wherein the canal component is in fluid communication with a drain to facilitate removal of the at least the sub-portion of the portion of the liquid from the rack system.

7. The rack system of claim 3, wherein the liquid redirection component comprises:

a plurality of lateral members oriented with and positioned along a length of the chassis;

at least one manifold adapted to receive the portion of the liquid from the plurality of lateral members; and at least one fluid disposal member in fluid communication with the at least one manifold and positioned to flow the at least the sub-portion of the portion of the liquid out from under the chassis.

8. The rack system of claim 7, wherein at least a portion of the plurality of lateral members, the at least one manifold, and the at least one fluid disposal member are formed from a liquid wicking material.

9. The rack system of claim 1, wherein the chassis is positioned above a second chassis in the rack system.

10. The rack system of claim 9, wherein the aggregation component has a thickness that is less than a distance between the chassis and the second chassis.

11. A system comprising:

a liquid cooling system adapted to dissipate heat generated by hardware components, the liquid cooling system comprising a cooling path adapted to direct a liquid through a at least a portion of a chassis adapted to house the hardware components of a data processing system that provides computer implemented services; and a liquid collection system adapted to extract a portion of the liquid in the chassis that escaped from the cooling path and into an interior of the chassis, the liquid collection system comprises:

an aggregation component that is positioned below the chassis and adapted to direct the portion of the liquid to a liquid redirection component, the aggregation component comprises:

a sheet of liquid impermeable material; and at least one attachment member adapted to attach the sheet to the chassis, the at least one attachment member comprises an adhesive to fixedly secure the sheet to the chassis, and when secured to the chassis the sheet is separated from the chassis by at least a thickness of the liquid redirection component; and the liquid redirection component that is positioned with the aggregation component and adapted to flow the portion of the liquid at least out from under the chassis.

12. The system of claim 11, wherein the liquid collection system further comprises:

a canal component that is adapted to receive at least a sub-portion of the portion of the liquid from the liquid redirection component.

13. The system of claim 12, wherein the liquid redirection component is further adapted to flow the at least the sub-portion of the portion of the liquid into an interior of the canal component.

14. The system of claim 13, wherein the canal component comprises:

a hollow tubular member positioned adjacent to the chassis; and an aperture that is:

positioned on an exterior of the hollow tubular member, and adapted to facilitate access to the interior of the canal component by at least a portion of the liquid redirection component.

15. The system of claim 14, wherein the hollow tubular member is adapted to:

prevent ambient airflow from ejecting the at least the sub-portion of the portion of the liquid from the interior of the canal component.

16. The system of claim 15, wherein the canal component is in fluid communication with a drain to facilitate removal of the at least the sub-portion of the portion of the liquid from a rack system to which the chassis is attached.

17. The system of claim 13, wherein the liquid redirection component comprises:

a plurality of lateral members oriented with and positioned along a length of the chassis;

at least one manifold adapted to receive the portion of the liquid from the plurality of lateral members; and at least one fluid disposal member in fluid communication with the at least one manifold and positioned to flow the at least the sub-portion of the portion of the liquid out from under the chassis.

18. The system of claim 17, wherein at least a portion of the plurality of lateral members, the at least one manifold, and the at least one fluid disposal member are formed from a liquid wicking material.

19. The system of claim 11, wherein the chassis is positioned above a second chassis in a rack system to which the chassis and the second chassis are attached.

20. The system of claim 19, wherein the aggregation component has a thickness that is less than a distance between the chassis and the second chassis.

* * * * *